(12) United States Patent
Kopp et al.

(10) Patent No.: US 11,164,994 B2
(45) Date of Patent: Nov. 2, 2021

(54) RADIATION-EMITTING SEMICONDUCTOR CHIP

(71) Applicant: OSRAM OLED GmbH, Regensburg (DE)

(72) Inventors: Fabian Kopp, Tanjung Tokong Penang (MY); Attila Molnar, Gelugor Penang (MY); Bjoern Muermann, Regensburg (DE); Franz Eberhard, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/310,787

(22) PCT Filed: Jun. 26, 2017

(86) PCT No.: PCT/EP2017/065715
§ 371 (c)(1),
(2) Date: Dec. 17, 2018

(87) PCT Pub. No.: WO2018/007186
PCT Pub. Date: Jan. 11, 2018

(65) Prior Publication Data
US 2019/0326471 A1    Oct. 24, 2019

(30) Foreign Application Priority Data

Jul. 8, 2016   (DE) .................... 10 2016 112 587.3

(51) Int. Cl.
*H01L 33/38*        (2010.01)
*H01L 33/46*        (2010.01)
(Continued)

(52) U.S. Cl.
CPC .............. *H01L 33/14* (2013.01); *H01L 33/20* (2013.01); *H01L 33/32* (2013.01); *H01L 33/46* (2013.01);
(Continued)

(58) Field of Classification Search
CPC ......... H01L 33/38; H01L 33/08; H01L 33/20; H01L 33/44; H01L 2933/0016;
(Continued)

(56) References Cited

U.S. PATENT DOCUMENTS 6,097,040 A * 8/2000 Morimoto ............... H01L 33/32
                                                         257/91
8,546,836 B2 * 10/2013 Kamiya .................. H01L 33/20
                                                         257/99
(Continued)

FOREIGN PATENT DOCUMENTS

CN     104701444 A     6/2015
DE     102014114674 A1     4/2016
(Continued)

*Primary Examiner* — Mary A Wilczewski
*Assistant Examiner* — Tsz K Chiu
(74) *Attorney, Agent, or Firm* — Slater Matsil, LLP

(57) ABSTRACT

A radiation-emitting semiconductor chip is disclosed. In an embodiment, a radiation-emitting semiconductor chip includes a semiconductor body configured to generate radiation, a first contact layer having a first contact area for external electrical contacting the semiconductor chip and a first contact finger structure connected to the first contact area, a second contact layer having a second contact area for external electrical contacting the semiconductor chip and a second contact finger structure connected to the second contact area, wherein the first contact finger structure and the second contact finger structure overlap in places, a current distribution layer electrically conductively connected to the first contact layer, a connection layer electrically conductively connected to the first contact layer via the current (Continued)

distribution layer and an insulation layer arranged in places between the connection layer and the current distribution layer, wherein the insulation layer has at least one opening.

4 Claims, 5 Drawing Sheets

(51) Int. Cl.
    *H01L 33/14* (2010.01)
    *H01L 33/20* (2010.01)
    *H01L 33/32* (2010.01)
    *H01L 33/62* (2010.01)
    *H01L 33/08* (2010.01)
(52) U.S. Cl.
    CPC .............. *H01L 33/62* (2013.01); *H01L 33/08* (2013.01); *H01L 33/38* (2013.01)
(58) Field of Classification Search
    CPC ....... H01L 33/387; H01L 33/42; H01L 33/46; H01L 33/405; H01L 33/10
    See application file for complete search history.

(56) References Cited

U.S. PATENT DOCUMENTS

| | | | |
|---|---|---|---|
| 8,872,204 B2* | 10/2014 | Yang | H01L 33/38 257/98 |
| 8,987,772 B2* | 3/2015 | Kim | H01L 33/36 257/99 |
| 9,123,865 B2* | 9/2015 | Sano | H01L 33/44 |
| 9,437,784 B2* | 9/2016 | Lee | H01L 33/505 |
| D795,822 S * | 8/2017 | Zhang | D13/180 |
| 9,882,093 B2 | 1/2018 | Sato et al. | |
| 10,199,542 B2* | 2/2019 | Chou | H01L 33/145 |
| 10,205,059 B2* | 2/2019 | Lin | H01L 33/405 |
| 10,497,835 B2* | 12/2019 | Jung | H01L 33/38 |
| 10,505,076 B2* | 12/2019 | Chou | H01L 33/145 |
| 10,734,554 B2* | 8/2020 | Heo | H01L 33/46 |
| 10,950,756 B2* | 3/2021 | Hwang | H01L 33/62 |
| 2006/0071228 A1* | 4/2006 | Sun | H01L 33/005 257/99 |
| 2006/0138436 A1* | 6/2006 | Chen | H01L 33/486 257/98 |
| 2007/0228388 A1* | 10/2007 | Ko | H01L 33/38 257/79 |
| 2007/0284606 A1 | 12/2007 | Sugimori | |
| 2008/0185606 A1* | 8/2008 | Sano | H01L 33/38 257/98 |
| 2009/0159909 A1* | 6/2009 | Lee | H01L 33/38 257/96 |
| 2009/0283787 A1* | 11/2009 | Donofrio | H01L 33/405 257/98 |
| 2010/0155752 A1 | 6/2010 | Lim et al. | |
| 2011/0156086 A1* | 6/2011 | Kim | H01L 33/38 257/99 |
| 2011/0198641 A1 | 8/2011 | Yahata et al. | |
| 2011/0241045 A1* | 10/2011 | Ye | H01L 33/20 257/98 |
| 2011/0278631 A1* | 11/2011 | Shen | H01L 33/38 257/99 |
| 2012/0032198 A1 | 2/2012 | Yeh et al. | |
| 2012/0049234 A1 | 3/2012 | Cheng | |
| 2012/0085988 A1 | 4/2012 | Yu et al. | |
| 2012/0326190 A1* | 12/2012 | Kim | H01L 51/5218 257/98 |
| 2014/0117389 A1* | 5/2014 | Lee | H01L 33/44 257/98 |
| 2014/0367730 A1* | 12/2014 | Kim | H01L 33/387 257/99 |
| 2015/0144980 A1 | 5/2015 | Tsai et al. | |
| 2015/0179890 A1 | 6/2015 | Sano | |
| 2017/0069794 A1* | 3/2017 | Kim | H01L 33/46 |

FOREIGN PATENT DOCUMENTS

| | | |
|---|---|---|
| DE | 102015102043 A | 8/2016 |
| DE | 102016101612 A1 | 8/2017 |
| DE | 102016105056 A1 | 9/2017 |
| EP | 2887408 A2 | 6/2015 |
| JP | 2010056195 A | 3/2010 |
| JP | 2012114343 A | 6/2012 |
| JP | 2014179586 A | 9/2014 |
| JP | 2016025213 A | 2/2016 |
| KR | 20150072344 A | 6/2015 |

\* cited by examiner

RADIATION-EMITTING SEMICONDUCTOR CHIP

This patent application is a national phase filing under section 371 of PCT/EP2017/065715, filed Jun. 26, 2017, which claims the priority of German patent application 102016112587.3, filed Jul. 8, 2016, each of which is incorporated herein by reference in its entirety.

TECHNICAL FIELD

The present application relates to a radiation-emitting semiconductor chip.

BACKGROUND

For the efficient operation of radiation-emitting semiconductor devices such as, for example, light-emitting diode semiconductor chips, an efficient current distribution in the lateral direction is desired. For this purpose, for example, metallic contact structures or transparent conductive layers can be used. However, this can lead to absorption losses, which reduce the efficiency of the semiconductor chip.

SUMMARY OF THE INVENTION

Embodiments provide a radiation-emitting semiconductor chip, which is characterized by high efficiency and low absorption losses.

Embodiments provide a radiation-emitting semiconductor chip comprising a semiconductor body. The semiconductor body has an active region intended for generating radiation. For example, the active region is intended for generating radiation in the ultraviolet, visible or infrared spectral range. In particular, the active region is arranged between a first semiconductor layer and a second semiconductor layer, wherein the first semiconductor layer and the second semiconductor layer are different from one another at least in places with respect to their conduction type, so that the active region is located in a pn junction. The first semiconductor layer, the second semiconductor layer and the active region may each be formed in one or more layers.

According to at least one embodiment of the radiation-emitting semiconductor chip, the semiconductor chip has a first contact layer. In particular, the first contact layer has a first contact area for external electrical contacting of the semiconductor chip. For example, the first contact area is formed for electrically contacting the first semiconductor layer. Furthermore, the first contact layer may have a first contact finger structure connected to the first contact area. The first contact finger structure is formed for lateral distribution of charge carriers, which are imprinted over the first contact area during operation of the radiation-emitting semiconductor chip.

A lateral direction is defined as a direction, which extends parallel to a main extension plane of the active region. Accordingly, a vertical direction extends perpendicular to the main extension plane of the active region.

According to at least one embodiment of the radiation-emitting semiconductor chip, the semiconductor chip has a second contact layer, which has a second contact area for external electrical contacting of the semiconductor chip. In particular, the second contact layer is formed for electrically contacting the second semiconductor layer. For example, the second contact layer has a second contact finger structure connected to the second contact area.

Expediently, there is no direct electrical contact between the first contact layer and the second contact layer. In particular, a current path extends between the first contact layer and the second contact layer through the semiconductor body, in particular through the active region.

According to at least one embodiment of the radiation-emitting semiconductor chip, the first contact finger structure and the second contact finger structure overlap at least in places in a plan view of the semiconductor chip. Regions in which the first contact finger structure and the second contact finger structure overlap may be used both for the lateral current distribution for the contacting of the first semiconductor layer and for the lateral current distribution for the contacting of the second semiconductor layer. For example, at least 10%, at least 30% or at least 90% of the first contact finger structure are located within the second contact finger structure in plan view of the semiconductor chip. The larger this percentage is, the more area of the semiconductor chip, which cannot be used for generating radiation anyway due to the second contact finger structure, can additionally be used for the charge carrier distribution via the first contact finger structure. Compared to a radiation-emitting semiconductor chip, in which the first contact layer and the second contact layer are arranged alongside one another without overlapping, the area of the active region covered by the contact layers can be reduced. However, one of the contact layers, for example, the first contact layer, may also have at least one contact finger, which is formed without overlap with the other, for example, the second contact layer. In contrast to this, the first contact area and the second contact area are expediently arrange without overlapping, so that both contact areas are accessible for the external electrical contacting.

In particular, the first contact finger structure may have a number of contact fingers larger than or equal to the number of contact fingers of the second contact finger structure.

A contact finger structure is generally understood to be a region of a contact layer, which has a comparatively small extent in comparison to the contact area provided for the electrical contacting, at least in one lateral direction.

According to at least one embodiment of the radiation-emitting semiconductor chip, the semiconductor chip has a current distribution layer. The current distribution layer is electrically conductively connected to the first contact layer. For example, the current distribution layer adjoins the first contact layer directly. For example, the first contact layer is arranged completely within the current distribution layer in a plan view of the semiconductor chip.

According to at least one embodiment of the radiation-emitting semiconductor chip, the semiconductor chip has a connection layer. The connection layer is electrically conductively connected to the first contact layer, for example, via the current distribution layer. In particular, the connection layer adjoins the semiconductor body directly, in particular, the first semiconductor layer. For example, the connection layer does not directly adjoin the first contact layer at any place.

According to at least one embodiment of the radiation-emitting semiconductor chip, the semiconductor chip has an insulation layer. The insulation layer, for example, contains a dielectric material. The dielectric material is an electrically weak or non-conductive, non-metallic material, whose charge carriers are generally not freely movable—for example, at the usual operating currents. The insulation layer contains, for example, at least one of the following materials: silicon nitride, silicon dioxide, silicon oxynitride, aluminum oxide, titanium oxide, tantalum oxide, niobium oxide.

The insulation layer covers, for example, at least 30%, at least 50%, at least 70% or at least 90% of the entire base area of the semiconductor chip in plan view. By way of example, the insulation layer covers at most 99% of the entire base area of the semiconductor chip in plan view.

For example, the insulation layer is arranged in places between the connection layer and the current distribution layer, in particular in the vertical direction. A direct vertical current path between the connection layer and the current distribution layer is thus prevented at least in places by means of the insulation layer.

For example, the insulation layer is arranged in vertical direction between the first contact layer and the second contact layer.

In at least one embodiment of the radiation-emitting semiconductor chip, the radiation-emitting semiconductor chip comprises a semiconductor body having an active region intended for generating radiation. The semiconductor chip comprises a first contact layer having a first contact area for electrically contacting the semiconductor chip and a first contact finger structure connected to the first contact area. The semiconductor chip comprises a second contact layer having a second contact area for external electrical contacting of the semiconductor chip and a second contact finger structure connected to the second contact area, wherein the first contact finger structure and the second contact finger structure overlap in places in plan view of the semiconductor chip. The semiconductor chip comprises a current distribution layer electrically conductively connected to the first contact layer. The semiconductor chip comprises a connection layer electrically conductively connected to the first contact layer via the current distribution layer. The semiconductor chip comprises an insulation layer containing a dielectric material, wherein the insulation layer is arranged in places between the connection layer and the current distribution layer.

According to at least one embodiment of the radiation-emitting semiconductor chip, the insulation layer covers the connection layer to at least 30% of the area of the connection layer. For example, the insulation layer covers the connection layer to at least 50%, to at least 70% or to at least 90%. The insulation layer may thus cover the connection layer over a large area. For example, the insulation layer covers the connection layer to at most 95% or at most 99%.

According to at least one embodiment of the radiation-emitting semiconductor chip, the insulation layer has at least one opening. For example, the connection layer and the current distribution layer adjoin one another in the opening. In other words, the connection layer and the current distribution layer are electrically connected to one another in the region of the opening. In particular, the connection layer and the current distribution layer adjoin one another only in the at least one opening. For example, the opening is surrounded by the material of the insulation layer along its entire circumference. For example, the opening is filled at least in regions with material of the current distribution layer.

According to at least one embodiment of the radiation-emitting semiconductor chip, the insulation layer has a plurality of openings. Via the position of the openings in the production of the semiconductor chip it is possible to adjust at which places the current distribution layer adjoins the connection layer. For example, the openings are formed with regard to their distribution density and/or their size, in such a way that a uniform lateral current impression is promoted in the semiconductor chip. A distance between two adjacent openings is, for example, between 5 µm and 60 µm inclusive, approximately between 20 µm and 50 µm inclusive. A diameter of the openings is in particular between 0.5 µm and 20 µm inclusive, for example, between 2 µm and 6 µm inclusive. In the case of a non-round opening, the diameter is understood to mean the longest lateral extent. The shape and/or size of the openings may also differ from each other. For example, one or more openings may be provided at the edge of the semiconductor chip, which are larger than openings at the center of the semiconductor chip.

According to at least one embodiment of the radiation-emitting semiconductor chip, the insulation layer is formed as a filter layer, which predominantly transmits incident radiation within a first angular range and predominantly reflects incident radiation within a second angular range. "Predominantly" means in particular that at least 60% of the radiation is transmitted or reflected.

In particular, the angles of the first angular range relative to the vertical direction are smaller than the angles of the second angular range. Radiation incident on the insulation layer at comparatively steep angles is therefore predominantly transmitted, while radiation incident at comparatively flat angles is predominantly reflected. Radiation components having a comparatively flat profile, which cannot be coupled out of the semiconductor chip anyway, are thus already retained at the insulation layer. Radiation absorption losses in layers arranged downstream of the insulation layer, for example, in the current distribution layer, can thus be reduced.

For example, the boundary between the first angular range and the second angular range is determined by the critical angle of total reflection, which can be derived from the refractive index of the semiconductor body and the refractive index of the surrounding medium. In this case, the first angular range comprises angles, which are smaller than this limit. The second angular range, on the other hand, comprises angles, which are larger than this limit.

The insulation layer formed in particular as a filter layer may consist of a single layer. This means, in particular that the insulation layer is formed homogeneously and is made, for example, of a single dielectric material. The dielectric material advantageously has an adapted refractive index, wherein "adapted" means that the refractive index of the dielectric material is larger than or equal to the refractive index of a medium surrounding the insulation layer. The surrounding medium is arranged downstream of the insulation layer proceeding from the semiconductor body. The surrounding medium comprises elements, which enclose the semiconductor body and in particular have a protective function. For example, the semiconductor body may have a passivation layer and/or encapsulation as a surrounding medium.

In an alternative embodiment, the insulation layer, which in particular is formed as a filter layer, is formed in multiple layers and has at least two sublayers, which differ from one another in their refractive index. Preferably, the filter layer comprises a layer sequence consisting of alternating sublayers having a higher refractive index and a lower refractive index. In particular, the sublayers with a higher refractive index have a lower thickness than the sublayers with a lower refractive index.

The insulation layer, which in particular is formed as a filter layer, preferably has a thickness of between 400 nm and 800 nm inclusive. When dimensioning the thickness of the insulation layer, care must be taken, on the one hand, to limit production effort, which is larger in the case of a multi-layer structure of the insulation layer than in the case of a single-layer structure, and, on the other hand, to achieve the desired filter characteristic, which can be better achieved with a multi-layer structure than with a single-layer structure. With a thickness between 400 nm and 800 nm inclusive a suitable compromise between production effort and filter characteristic can be achieved.

According to at least one embodiment of the radiation-emitting semiconductor chip, the insulation layer adjoins the connection layer and the current distribution layer. Between the connection layer and the current distribution layer, there are no further layers in the vertical direction apart from the insulation layer, at least in places. In other words, the insulation layer is at least in places the only layer arranged between the connection layer and the current distribution layer.

According to at least one embodiment of the radiation-emitting semiconductor chip, the connection layer has a thickness less than the current distribution layer. For example, the current distribution layer is at least twice as thick as the connection layer. For example, a thickness of the connection layer is between 3 nm and 30 nm inclusive, approximately between 5 nm and 25 nm inclusive. A thickness of the current distribution layer is, for example, between 30 nm and 200 nm inclusive, approximately between 50 nm and 150 nm inclusive. In particular, due to the larger thickness, the current distribution layer is characterized by a larger transverse conductivity than the connection layer. The connection layer, on the other hand, exhibits lower absorption losses for the radiation passing through the connection layer due to the lower thickness.

Radiation absorption losses in the current distribution layer can be reduced by means of the insulation layer acting in particular as a filter layer. In other words, a high transverse conductivity with at the same time low absorption losses is achieved by means of the combination of a connection layer and a current distribution layer and in particular an insulation layer arranged therebetween in the vertical direction.

According to at least one embodiment of the radiation-emitting semiconductor chip, at least 50% of the entire area of the second contact finger structure overlaps the first contact finger structure. In other words, at least half of the area covered by the second contact finger structure is also used for the current distribution via the first contact finger structure.

According to at least one embodiment of the radiation-emitting semiconductor chip, the semiconductor body has at least one recess extending from the radiation exit surface through the active region. In particular, the second contact layer is electrically conductively connected to the semiconductor body in the recess. For example, the second contact layer adjoins the semiconductor body directly, in particular the second semiconductor layer. For example, material of the insulation layer and/or material of the current distribution layer is arranged in the recess at least in places.

However, the recess can also be completely filled with material of the second contact layer.

According to at least one embodiment of the radiation-emitting semiconductor chip, the insulation layer is arranged between the first contact layer and the second contact layer. The insulation layer also serves for the electrical separation between the first and the second contact layer, so that there is in particular no direct current path between these contact layers.

According to at least one embodiment of the radiation-emitting semiconductor chip, there is no direct vertical current path between the first contact layer and the semiconductor body at any place of the semiconductor chip. A charge carrier injection from the first contact layer into the semiconductor body thus does not take place directly below the first contact layer, but at a distance from it in the lateral direction. This reduces the amount of radiation generated in the active region directly below the first contact layer and is prevented from emerging from the first contact layer.

According to at least one embodiment of the radiation-emitting semiconductor chip, a dielectric mirror layer is arranged in regions between the semiconductor body and the current distribution layer. For example, the dielectric mirror layer comprises a plurality of layer pairs, wherein the layers of the layer pairs are different from each other with respect to their refractive indices. For example, the dielectric mirror layer has between three and ten sublayers inclusive, wherein mutually adjoining sublayers differ from one another in terms of their refractive index. Preferably, the dielectric mirror layer comprises a layer sequence of alternating sublayers having a higher refractive index and a lower refractive index. In particular, the sublayers with a higher refractive index have a lower thickness than the partial layers with a lower refractive index.

In particular, the dielectric mirror layer is formed on the first and/or on the second contact layer in order to avoid absorption losses.

The dielectric mirror layer covers in particular the side surfaces of the recesses in places. For example, the dielectric mirror layer is arranged in a vertical direction between the connection layer and the current distribution layer in places, in particular between the connection layer and the insulation layer. This prevents radiation from escaping from the semiconductor body at the side surface of the recess, and subsequently causing absorption losses at the first contact layer and/or the second contact layer.

According to at least one embodiment of the radiation-emitting semiconductor chip, the dielectric mirror layer overlaps in places with the first contact layer and with the second contact layer in a plan view of the semiconductor chip. Radiation absorption can thus be avoided or at least reduced both on the first contact layer and on the second contact layer.

According to at least one embodiment of the radiation-emitting semiconductor chip, the connection layer and/or the current distribution layer contains a TCO material.

Transparent electrically conductive oxides ("TCO" for short) are transparent, conductive materials, generally metal oxides, such as, for example, zinc oxide, tin oxide, cadmium oxide, titanium oxide, indium oxide or indium tin oxide (ITO). In addition to binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides to the group of TCOs. Furthermore, the TCOs do not necessarily correspond to a stoichiometric composition and can also be p- or n-doped.

The connection layer and the current distribution layer may be formed from the same material. Alternatively, the connection layer and the current distribution layer may also have different material compositions from one another. For example, the contact layer may be selected regarding a good contact resistance to the semiconductor body and/or the current distribution layer may be selected regarding a high transmission for radiation generated in the active region.

According to at least one embodiment of the radiation-emitting semiconductor chip, the dielectric mirror layer is arranged in places between the semiconductor body and the second contact layer. For example, the dielectric mirror layer has a recess, in which the second contact layer directly adjoins the semiconductor body. By means of the dielectric mirror layer, it can be at least partially avoided that radiation generated in the active area is absorbed by the second contact layer.

According to at least one embodiment of the radiation-emitting semiconductor chip, the second contact layer has a mirror layer. For example, silver or aluminum is suitable for the mirror layer. Particularly high reflectivities in the visible spectral range can be achieved with silver. For example, the mirror layer has a thickness of between 300 nm and 2 μm inclusive.

According to at least one embodiment of the radiation-emitting semiconductor chip, the second contact layer has a contacting layer. The contacting layer is formed to provide a good ohmic contact to the semiconductor body, in particular to the second semiconductor layer. For example, the contacting layer has a thickness of between 3 nm and 100 nm inclusive. The contacting layer is arranged in particular between the mirror layer and the second semiconductor layer. A material which would form a comparatively poor contact to the semiconductor body is also suitable for the mirror layer, such as silver to n-conducting nitride compound semiconductor material. For example, the contacting layer contains a TCO material, such as ITO or ZnO. In particular, a TCO material for the contacting layer and silver for the mirror layer can be used to realize a contact layer, which is characterized by a high reflectivity and at the same time a good electrical contact with the second semiconductor layer.

According to at least one embodiment of the radiation-emitting semiconductor chip, the second contact layer has a barrier layer. In particular, the mirror layer is arranged between the contacting layer and the barrier layer. For example, a metal such as Ti, Pt, Cu or Au or a TCO material such as ITO or ZnO is suitable as a barrier layer. For example, the barrier layer has a thickness of between 30 nm and 400 nm inclusive. The mirror layer can be encapsulated with the barrier layer. A material is therefore also suitable for the mirror layer where there is a risk of migration, e.g., due to moisture.

These materials and/or at least one or all of the layers can also be used for the first contact layer.

The following effects can in particular be achieved with the radiation-emitting semiconductor chip described.

The regions in which a metal layer, such as the first contact layer or the second contact layer, is directly adjacent to the semiconductor chip are reduced. As a result, the brightness of the radiation-emitting semiconductor chip increases at the same operating current.

Absorption losses are reduced via the insulation layer, in particular in the current distribution layer. Even if a comparatively thick current distribution layer is used with regard to high transverse conductivity, absorption losses are reduced by means of the insulation layer. In particular, the insulation layer can fulfil the function of an angle-selective filter layer.

The regions in which the highest current density occurs during operation of the semiconductor chip can be adjusted by means of the at least one opening of the insulation layer. In particular, these regions can be laterally spaced apart from the first contact layer. For example, the regions in which the highest current density occurs can also be laterally spaced apart from the first contact finger structure.

As a result, the amount of light generated in the active region increases and the loss of efficiency at high operating currents (also referred to as "droop") is reduced. A higher current density distribution and an associated homogeneous light distribution on the radiation exit surface of the semiconductor chip also increases the efficiency of a radiation conversion material arranged downstream, whereby the brightness of a component with such a radiation-emitting semiconductor chip is further increased.

Furthermore, absorption losses at the second contact layer can also be avoided, for example, by means of the dielectric mirror layer. By means of an arrangement of the dielectric mirror layer on a side surface of the semiconductor chip, for example, on the side surface of the recess, absorption losses on the second contact layer can be further avoided or at least reduced.

The second contact layer itself can be characterized by particularly low absorption losses, in particular by a multi-layer structure with a contacting layer and a mirror layer. Migration effects can be suppressed by means of the barrier layer, so that the freedom in the selection of the material for the mirror layer is increased.

BRIEF DESCRIPTION OF THE DRAWINGS

Further embodiments and functionalities result from the following description of the exemplary embodiments in connection with the Figures.

The figures show.

Identical, similar or similar acting elements are provided with the same reference signs in the figures.

The figures and the proportions of the elements shown in the figures are not to be regarded as true to scale. Rather, individual elements may be oversized to make them easier to display and/or understand.

DETAILED DESCRIPTION OF ILLUSTRATIVE EMBODIMENTS

Figure 1A:
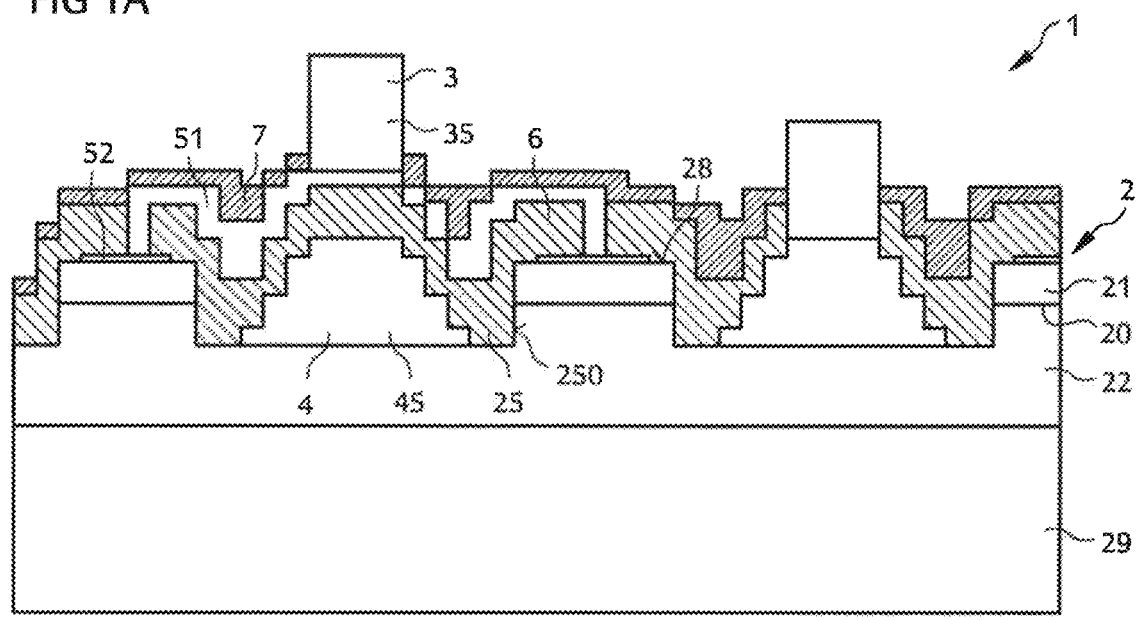
FIG. 1A shows a first exemplary embodiment of a radiation-emitting semiconductor chip in a schematic sectional view.
Figure 1B:
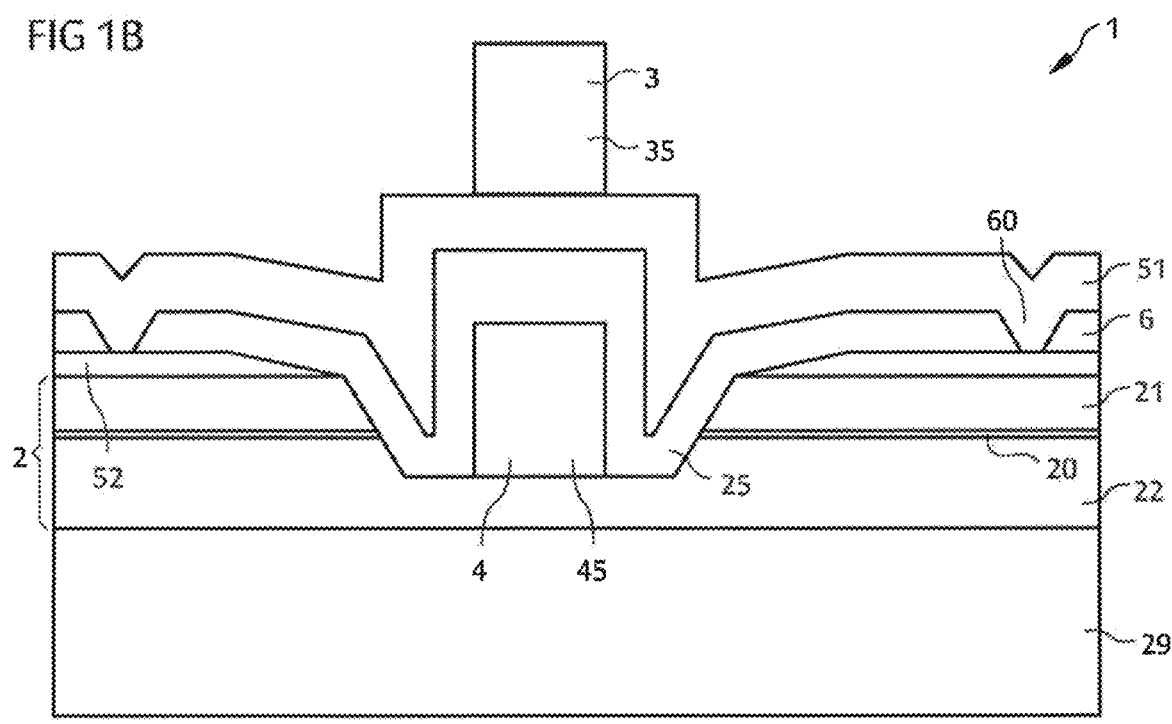
FIG. 1B shows a schematic representation of a section in a schematic sectional view.
Figure 2A:
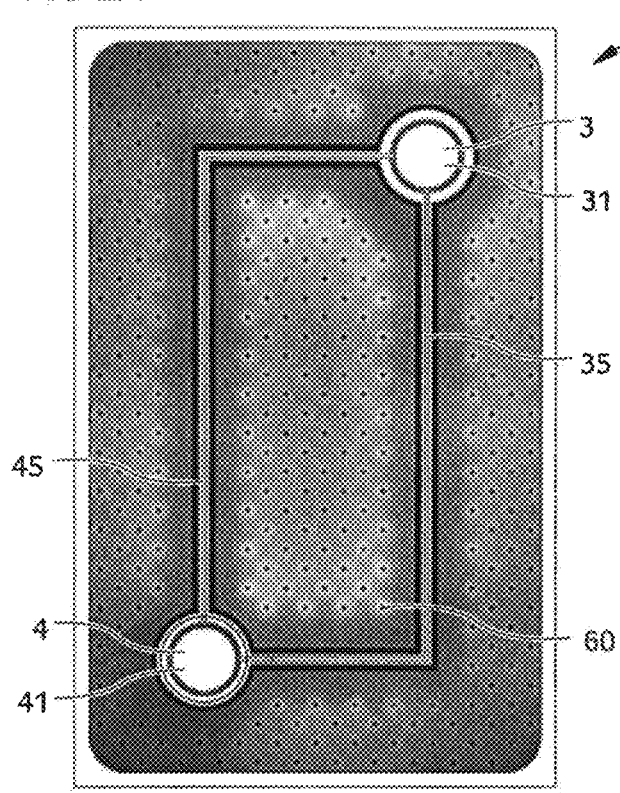
FIG. 2A shows a simulation result of a current density distribution for a radiation-emitting semiconductor chip according to the an embodiment.

FIG. 1A shows a first exemplary embodiment of a radiation-emitting semiconductor chip 1, wherein FIG. 1B shows a section of said semiconductor chip in a sectional view. In plan view, the radiation-emitting semiconductor chip can be formed, for example, as shown in FIG. 2A.

The radiation-emitting semiconductor chip 1 has a semiconductor body 2 with a semiconductor layer sequence. The semiconductor body 2 comprises in particular an active region 20 intended for generating radiation, which is arranged between a first semiconductor layer 21 of a first conductivity type (for example, p-conducting) and a second semiconductor layer 22 of a second conductivity type different from the first conductivity type (for example, n-conducting). The semiconductor body 2, in particular the active region 20, is preferably based on a III-V compound semiconductor material, in particular on a nitride compound semiconductor material.

"Based on nitride compound semiconductor material" in the present context means that at least one layer of the semiconductor regions comprises a nitride III/V compound semiconductor material, preferably $Al_nGa_mIn_{1-n-m}N$, wherein $0 \leq n \leq 1$, $0 \leq m \leq 1$ and $n+m \leq 1$. In this case, this material does not necessarily have to have a mathematically exact composition according to the above formula. Rather, it may have one or more dopants and additional constituents, which substantially do not change the characteristic physical properties of the $Al_nGa_mIn_{1-n-m}N$ material. For the sake of simplicity, however, the above formula only contains the essential constituents of the crystal lattice (Al, Ga, In, N), even if these may be partially replaced by small quantities of other substances.

The semiconductor body 2 is arranged on a carrier 29. In particular, the carrier is a growth substrate for the semiconductor layer sequence of the semiconductor body. For a semiconductor body based on nitride compound semiconductor material, sapphire, silicon carbide or gallium nitride are suitable as growth substrates.

A first contact layer 3 and a second contact layer 4 are arranged on a radiation exit surface 28 facing away from the carrier 29. The first contact layer 3 has a first contact area 31 for the external electrical contacting of the first semiconductor layer 21. The second contact layer 4 has a second contact area 41 intended for the external electrical contacting of the second semiconductor layer.

The first contact layer 3 furthermore has a first contact finger structure 35, which is connected to the first contact area 31. Accordingly, the second contact layer 4 has a second contact finger structure 45, which is electrically conductively connected to the second contact area 41.

In the exemplary embodiment shown in FIG. 2A, the contact finger structures 35, 45 each comprise two contact fingers, which extend from the respective contact area 31, 41. The contact fingers each have a kink, so that the two contact fingers together form a frame-shaped structure. Deviating therefrom, however, other structures are also conceivable, for example, contact fingers, which are curved in places, a comb-shaped embodiment or an embodiment of the contact finger structures similar to the veining of a leaf. The number of contact fingers can also be varied within wide limits. The number of contact fingers of the first contact finger structure 35 and of the second contact finger structure 45 can also be different from one another. For example, the number of contact fingers of the first contact finger structure is larger than the number of contact fingers of the second contact finger structure.

The first contact finger structure 35 and the second contact finger structure 45 overlap in a plan view of the radiation-emitting semiconductor chip. In this way, areas of the semiconductor chip, in which the active area 20 is removed anyway for the formation of the second contact finger structure 45, can also be used for the current distribution for making electrical contact with the first semiconductor layer 21.

Deviating from the exemplary embodiment described, the first contact finger structure 35 and the second contact finger structure 45 can also overlap to a smaller percentage. For example, the first contact finger structure 35 may have at least one contact finger, which does not overlap with the second contact finger structure 45 over at least half of its main axis of extension.

The second contact layer 4, in particular the second contact finger structure 45, adjoins the second semiconductor layer 22 in a recess 25 of the semiconductor body. By means of the recess, the second semiconductor layer 22 covered by the first semiconductor layer 21 is thus exposed in places for making contact with the second contact layer 4.

An insulation layer 6 is arranged between the first contact layer 3 and the second contact layer 4 in vertical direction. The insulation layer 6 covers the radiation exit surface 28 of the semiconductor body 2 in regions. In the exemplary embodiment shown, the insulation layer 6 also covers the side surfaces 250 of the recesses 25.

Furthermore, the semiconductor chip 1 comprises a current distribution layer 51, which is electrically conductively connected to the first contact layer 3. Furthermore, the radiation-emitting semiconductor chip 1 comprises a connection layer 52. The connection layer 52 is electrically conductively connected to the first contact layer via the current distribution layer 51. The insulation layer 6 is arranged in places between the current distribution layer 51 and the connection layer 52, in particular in the vertical direction.

The insulation layer 6 has a plurality of openings 6o, in which the current distribution layer 51 and the connection layer 52 adjoin one another. During operation of the radiation-emitting semiconductor chip, the current density impressed into the semiconductor chip is highest in a region vertically below the openings 60. The openings in the insulation layer 6 can therefore be used to define the regions, in which the current density is highest. In contrast, without an insulation layer between the current distribution layer 51 and the connection layer 52, the current density in the region around the first contact layer 3 would be highest. In lateral regions further away from the contact layer 3, however, only a comparatively small charge carrier injection would take place.

The openings 60 are expediently arranged in the lateral direction in such a way that in lateral direction a homogeneous current density distribution is achieved, as far as possible. In particular, the arrangement of the openings on the radiation exit surface 28 is also selected on the basis of the respective material parameters of the current distribution layer 51 and of the connection layer 52, in such a way that a current density distribution, which is as homogeneous as possible, is achieved.

For example, edge regions of the radiation exit surface 28 can be provided with more openings than central regions of the radiation exit surface. The distances between the openings can be between 20 µm and 50 µm inclusive. A suitable diameter of the openings is in particular between 1 µm and 15 µm, for example, between 2 µm and 6 µm inclusive.

Despite the openings 6o, the insulation layer 6 can cover the connection layer over a large area, for example, to at least 30%, to at least 50% or at least 70% of the area of the connection layer in a plan view of the semiconductor chip. For example, the insulation layer covers the connection layer of at most 90% or at most 95%.

The connection layer 52 has a lower thickness than the current distribution layer 51. In contrast to the current distribution layer 51, the connection layer 52 does not have to have a high transverse conductivity. A comparatively small thickness of the connection layer 52 can reduce absorption losses in the connection layer.

As seen from the active region 20, the insulation layer 6 is arranged in front of the current distribution layer 51 at least in places. The insulation layer 6 can in particular fulfil the function of a filter layer, wherein the filter layer has a higher reflectivity for radiation that extends at comparatively large angles to the normal to the main extension plane of the active region 20 than for radiation that impinges at a comparatively small angle to the normal. As a result, radiation components, which could not escape from the semiconductor chip 1 anyway due to total reflection can already be reflected in a largely loss-free manner at the insulation layer 6. Absorption losses in the current distribution layer 51 can thus be reduced. The insulation layer can, for example, cover at least 50%, approximately at least 70% or at least 90% of the entire base area of the semiconductor chip in a plan view. Absorption losses can thus be avoided particularly efficiently by means of the insulation layer 6.

In particular, the transmission can be increased in comparison to a conventional semiconductor chip for radiation in a first angular range. Here, the first angular range refers to angles $\alpha$ with $0° \leq \alpha \leq \alpha_{tot}$, wherein $\alpha_{tot}$ indicates the critical angle of total reflection. At angles $\alpha$ which are larger than the critical angle $\alpha_{tot}$, i.e., in a second angular range with $\alpha_{tot} < \alpha \leq 90°$, the absorption of the described semiconductor chip is considerably reduced compared to a conventional semiconductor chip. The first angular range represents a conical region with a main axis parallel to the vertical direction. The critical angle of total reflection $\alpha_{tot}$ is determined by the refractive index of the semiconductor body 2 and the refractive index of the surrounding medium, wherein, for example, a semiconductor body 2 formed from GaN with a refractive index n=2.5 and a surrounding medium with a refractive index n=1.55 results in a critical angle $\alpha_{tot}$=arcsin(1.55/2.5)=38.3°.

A particularly efficient filter effect can result from a multi-layer structure of the insulation layer with an alternating arrangement of layers with a lower and higher refractive index. However, even with a single-layer insulation layer, a filtering effect can already be achieved.

On the side facing away from the carrier 29, the radiation-emitting semiconductor chip 1 can be closed off in regions by a passivation layer 7. The passivation layer serves in particular to protect the semiconductor body against external stresses such as moisture, dust or mechanical stress.

The current distribution layer 51 and the connection layer 52 can each have the same material or different materials from one another. The current distribution layer and the connection layer preferably contain a TCO material, for example, ITO.

The first contact layer 3 and the second contact layer 4 or at least a partial layer thereof can each be metallic. External electrical contacting of the semiconductor chip 1 is thereby simplified.

Figure 1C:
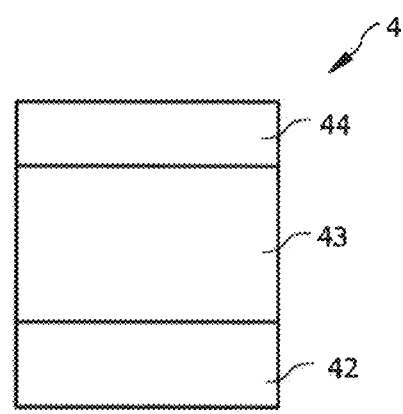
FIG. 1C shows an enlarged representation of the section of the sectional view in FIG. 1B.

A possible multi-layer structure of the second contact layer 4 is schematically shown in FIG. 1C.

The second contact layer comprises a connecting layer 42, a mirror layer 43 and a barrier layer 44.

For example, silver or aluminum is suitable for the mirror layer. Particularly high reflectivities in the visible spectral range can be achieved with silver. For example, the mirror layer has a thickness of between 300 nm and 2 µm inclusive.

A good ohmic contact to the semiconductor body can be formed by means of the connecting layer 42, in particular when using a material for the mirror layer 43, which would form a comparatively poor contact with the semiconductor body, such as silver to n-conducting nitride compound semiconductor material. For example, the contacting layer has a thickness of between 3 nm and 100 nm inclusive. The contacting layer is arranged in particular between the mirror layer and the second semiconductor layer. For example, the contacting layer contains a TCO material, such as ITO or ZnO. In particular with a TCO material for the contacting layer and silver for the mirror layer, the second contact layer 4 can be characterized by high reflectivity and at the same time good electrical contact to the second semiconductor layer.

A metal, such as Ti, Pt, Cu or Au or a TCO material, such as ITO or ZnO is suitable for the barrier layer 44. For example, the barrier layer has a thickness of between 30 nm and 400 nm inclusive. The mirror layer 43 can be encapsulated by means of the barrier layer. A material is thus also suitable for the mirror layer, where there is a risk of migration, e.g., due to moisture, in particular silver.

The first contact layer 3 can also have a multi-layer structure and have at least one of the materials described in connection with the second contact layer.

Simulation results of the lateral current density distribution for an above-described radiation-emitting semiconductor chip 1 are shown in FIG. 2A, wherein regions of the semiconductor body with a high current density are represented bright and regions with a low current density are represented dark. By means of the lateral separation of the direct charge carrier injection via the connection layer 52 into the semiconductor body 2 from the position of the contact finger structure 35, the homogeneity of the charge carrier density in the lateral direction can be significantly increased.

Figure 2B:
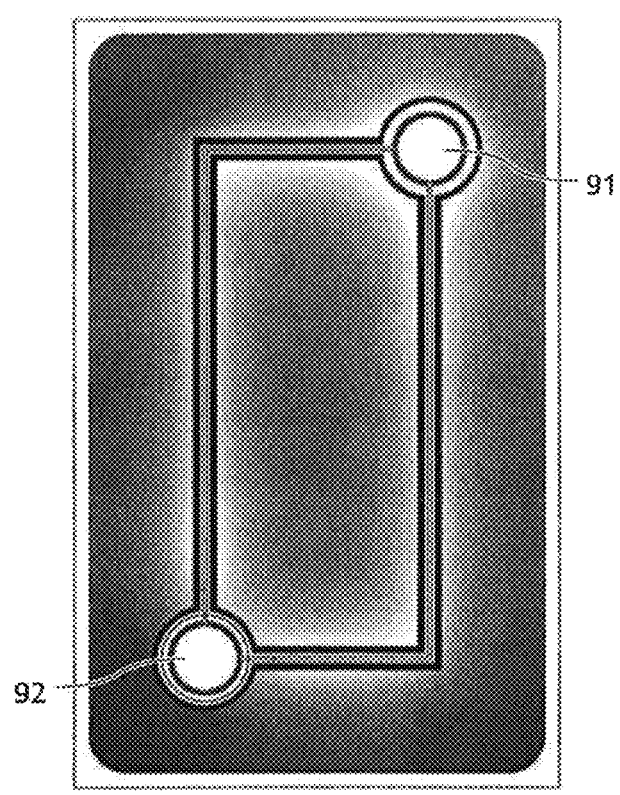
FIGS. 2B and 2C show simulation results of current density distributions for comparison structures.
Figure 2C:
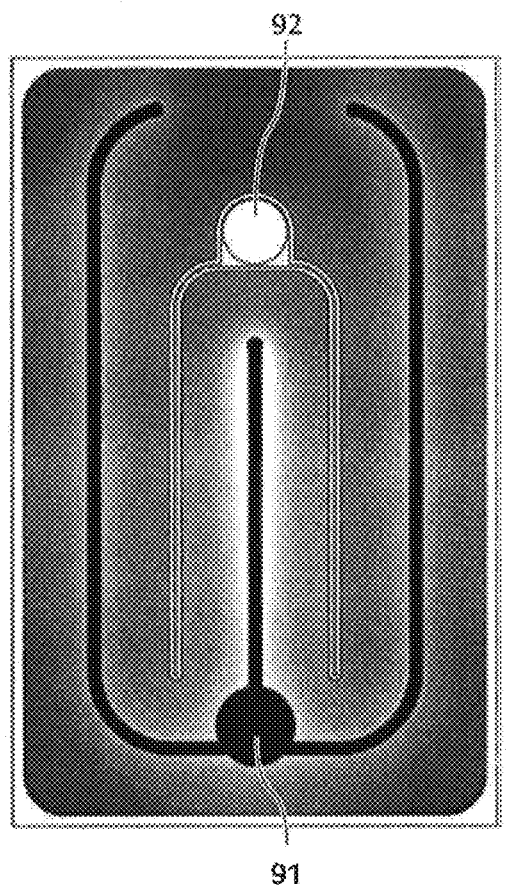

This is represented by simulation results for comparison structures shown in FIGS. 2B and 2C. In the case of the semiconductor chips shown in FIG. 2C, a first contact structure 91 and a second contact structure 92 are arranged alongside one another without overlapping. As a result, a comparatively large area of the semiconductor chip 1 is lost for radiation generation due to the large total area of the contact structures 91, 92.

In the exemplary embodiment shown in FIG. 2B, the first contact structure 91 and the second contact structure 92 overlap in a plan view of the semiconductor chip. Due to the smaller area covered with metal, the absorption losses are also reduced. However, there is a significantly increased current density in the immediate vicinity of the contact bars arranged one above the other, since the charge carriers choose the shortest current path between the contact bars and the structure of the semiconductor chip, in contrast to the present invention, does not provide countermeasures for this. Therefore, there is no laterally homogeneous current impression.

By means of the described radiation-emitting semiconductor chip, absorption losses can be significantly minimized compared to the state of the art and, furthermore, the homogeneity of the current density distribution in the lateral direction can be increased.

Figure 3:
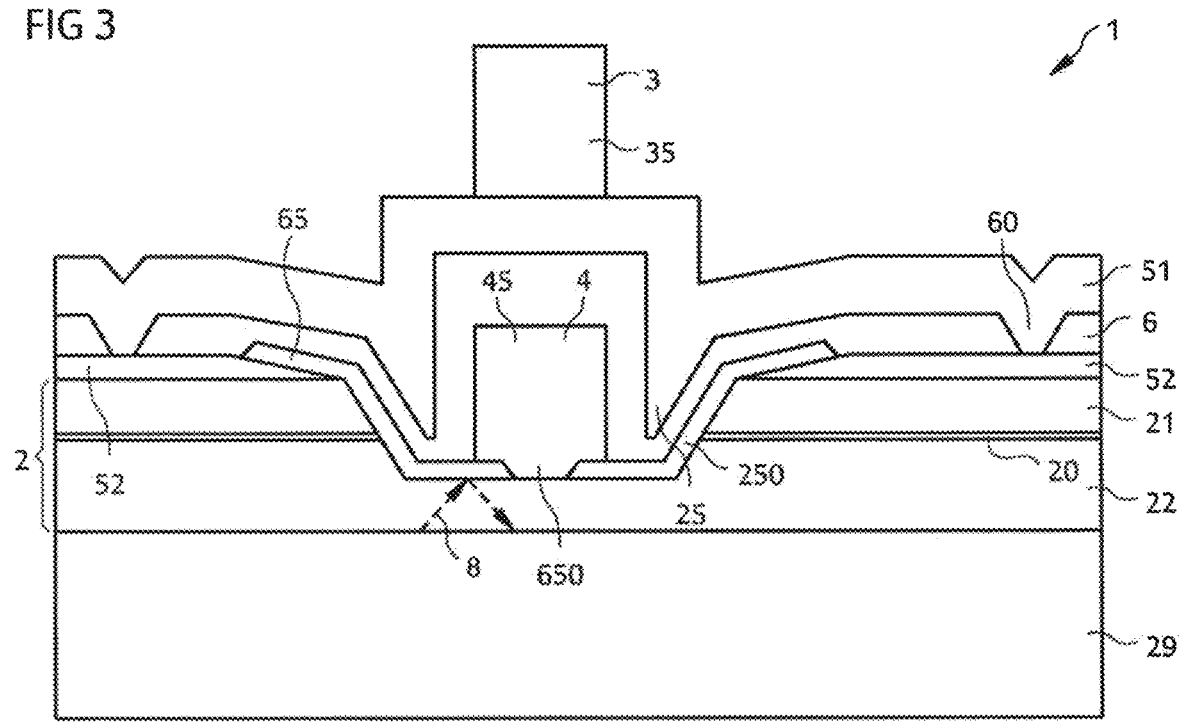
FIG. 3 shows a second exemplary embodiment of a radiation-emitting semiconductor chip in a schematic sectional view.

The second exemplary embodiment shown in FIG. 3 corresponds substantially to the first exemplary embodiment in connection with the FIGS. 1A, 1B and 1C.

In contrast to this, the radiation-emitting semiconductor chip 1 additionally has a dielectric mirror layer 65. The dielectric mirror layer 65 is arranged in regions between the semiconductor body 2 and the first contact layer 3. In particular, the dielectric mirror layer 65 overlaps with the first contact layer 3 and the second contact layer 4. The dielectric mirror layer 65 has a recess 650, in which the second contact layer 4 is adjacent to the semiconductor body 2, in particular to the second semiconductor layer 22. The dielectric mirror layer 65, for example, has a plurality of layer pairs, wherein the layers of a layer pair each have different refractive indices from one another. The materials specified for the insulation layer in the general part of the description are particularly suitable for the dielectric mirror layer. The individual sublayers of the dielectric mirror layer are not explicitly shown in the figure for a simplified representation.

By means of the dielectric mirror layer 65, radiation absorption on the second contact layer 4 can be avoided. This is represented by means of an arrow 8, which indicates a radiation reflected at the dielectric mirror layer 65. Furthermore, the dielectric mirror layer 65 also covers the side surface 250 of the recess 25. This prevents radiation escaping through the side surface from being absorbed at the first contact layer 3 or at the second contact layer 4.

The dielectric mirror layer is arranged in particular in regions between the insulation layer 6 and the semiconductor body 2. Furthermore, the dielectric mirror layer 65 extends, vied in the vertical direction, in regions between the current distribution layer 51 and the connection layer 52. In contrast, the dielectric mirror layer 65 and the connection layer 52 can also be arranged without overlapping with respect to one another. The current distribution layer 51 can completely cover the dielectric mirror layer 65 in a plan view of the semiconductor chip.

The third exemplary embodiment shown in FIG. 4 corresponds substantially to the second exemplary embodiment described in connection with FIG. 3.

In contrast to this, the recess 25 is completely or at least almost completely filled with material of the dielectric mirror layer 65 and the second contact layer 4. In this exemplary embodiment, the electrical contacting of the second semiconductor layer 22 is carried out via recesses 650 of the dielectric mirror layer 65 arranged next to one another.

Preferably, the lateral extent of the recesses 650 is also limited along a lateral main extension direction of the associated contact finger of the second contact finger structure 45. The recesses are thus surrounded along their entire circumference by material of the dielectric mirror layer. In other words, the second contact finger structure 45 can be completely underlaid with material of the dielectric mirror layer at least in some places along the main extension direction of the associated contact finger in a lateral transverse direction to the main extension direction of the contact finger. Radiation absorption losses at the second contact layer 4 can thus be further reduced.

Figure 4:
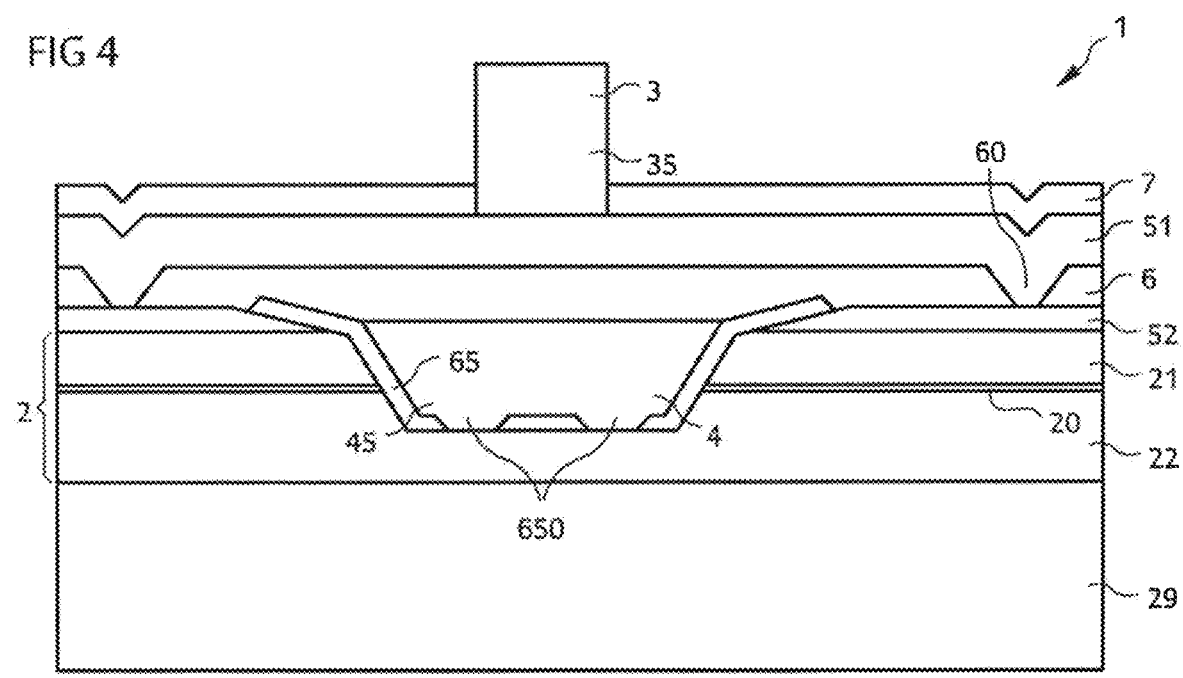
FIG. 4 shows a third exemplary embodiment of a radiation-emitting semiconductor chip in a schematic sectional view.

Furthermore, FIG. 4 shows a passivation layer 7, which is formed on the side of the semiconductor body 2 facing away from the carrier 29. This passivation layer can also be used in the exemplary embodiment shown in FIG. 3.

In the lateral direction, the contact finger of the first contact finger structure 35 overlapping with the recess 25 has a smaller lateral extent than the associated contact finger of the second contact finger structure 45. Absorption losses on the second contact finger structure can thus be further reduced.

The invention is not restricted to the exemplary embodiments by the description on the basis of the exemplary embodiments. Rather, the invention includes each new feature and each combination of features, which includes in particular each combination of features in the patent claims, even if this feature or this combination itself is not explicitly indicated in the patent claims or exemplary embodiments.

The invention claimed is:

1. A radiation-emitting semiconductor chip comprising:
a semiconductor body having an active region configured to generate radiation;
a first contact layer having a first contact area for external electrical contacting the radiation-emitting semiconductor chip and a first contact finger structure connected to the first contact area;
a second contact layer having a second contact area for external electrical contacting the radiation-emitting semiconductor chip and a second contact finger structure connected to the second contact area, wherein the first contact finger structure and the second contact finger structure overlap in places in plan view of the radiation-emitting semiconductor chip;
a current distribution layer electrically conductively connected to the first contact layer;
a connection layer electrically conductively connected to the first contact layer via the current distribution layer;
an insulation layer containing a dielectric material, wherein the insulation layer is arranged in places between the connection layer and the current distribution layer; and
a dielectric mirror layer arranged in regions between the semiconductor body and the current distribution layer,
wherein the insulation layer has at least one opening, in which the connection layer and the current distribution layer adjoin one another, and
wherein a diameter of the openings is between 2 µm and 6 µm inclusive.

2. The radiation-emitting semiconductor chip according to claim 1, wherein the dielectric mirror layer overlaps in places with the first contact layer and with the second contact layer in plan view of the radiation-emitting semiconductor chip.

3. The radiation-emitting semiconductor chip according to claim 1, wherein the dielectric mirror layer is arranged in places between the semiconductor body and the second contact layer.

4. The radiation-emitting semiconductor chip according to claim 1, wherein the dielectric mirror layer comprises a layer sequence composed of alternating sublayers having a higher refractive index and a lower refractive index.

* * * * *